US010222257B2

United States Patent
Kim et al.

(10) Patent No.: US 10,222,257 B2
(45) Date of Patent: Mar. 5, 2019

(54) OSCILLATION CIRCUIT INCLUDING AN ULTRAVIOLET SENSOR

(71) Applicant: KOREA ELECTRONICS TECHNOLOGY INSTITUTE, Seongnam-si, Gyeonggi-do (KR)

(72) Inventors: Kunnyun Kim, Yongin-si (KR); Yeon Hwa Kwak, Seoul (KR); Hae Kwan Oh, Suwon-si (KR)

(73) Assignee: KOREA ELECTRONICS TECHNOLOGY INSTITUTE, Seongnam-si (KR)

( * ) Notice: Subject to any disclaimer, the term of this patent is extended or adjusted under 35 U.S.C. 154(b) by 0 days.

(21) Appl. No.: 15/873,803

(22) Filed: Jan. 17, 2018

(65) Prior Publication Data

US 2018/0143069 A1   May 24, 2018

Related U.S. Application Data

(63) Continuation of application No. PCT/KR2015/007464, filed on Jul. 17, 2015.

(51) Int. Cl.
*G01J 1/42* (2006.01)
*H01L 31/09* (2006.01)
(Continued)

(52) U.S. Cl.
CPC .............. *G01J 1/429* (2013.01); *G01J 1/42* (2013.01); *H01L 31/09* (2013.01); *H03H 9/02976* (2013.01); *G01J 2001/4446* (2013.01)

(58) Field of Classification Search
CPC ......... G01N 29/022; G01N 2291/0256; G01N 2291/0423; G01J 1/429; G01J 1/42; G01J 2001/4446; H01L 31/09; H01L 9/02976
See application file for complete search history.

(56) References Cited

U.S. PATENT DOCUMENTS 5,656,414 A * 8/1997 Chou ............... G03F 7/095
430/269
7,473,551 B2   1/2009 Warthoe
(Continued)

FOREIGN PATENT DOCUMENTS

JP   09-243618 A   9/1997

OTHER PUBLICATIONS

Lee et al., "An ultraviolet sensor using spin-coated ZnO nanoparticles based on surface acoustic waves", Microelectronic Engineering, vol. 111—5 pages. (2013).
(Continued)

*Primary Examiner* — Kiho Kim
(74) *Attorney, Agent, or Firm* — Knobbe Martens Olson & Bear LLP (57) ABSTRACT

An ultraviolet-ray (UV) sensor is disclosed. In one embodiment, the UV sensor includes a piezoelectric material, a sensing film arranged on the piezoelectric material and senses ultraviolet rays, an elastic wave input unit arranged on one end of the sensing film on the piezoelectric material and provides the sensing film with an elastic wave generated based on an electrical signal and an elastic wave output unit arranged on the other end of the sensing film on the piezoelectric material and senses a change in frequency of the electrical signal generated based on the provided elastic wave. The UV sensor improves sensitivity of the sensor by enabling the particles having large surface areas due to their characteristics to react with a larger amount of ultraviolet rays. the UV sensor can secure price competitiveness since the UV sensor measures a change in frequency of the elastic wave using zinc oxide (ZnO) nanoparticles.

13 Claims, 8 Drawing Sheets

(51) Int. Cl.
*H03H 9/02* (2006.01)
*G01J 1/44* (2006.01)

(56) References Cited

U.S. PATENT DOCUMENTS

| | | |
|---|---|---|
| 2003/0201694 A1 | 10/2003 | Lu et al. |
| 2005/0116263 A1 | 6/2005 | Lu et al. |
| 2006/0024813 A1 | 2/2006 | Warthoe |
| 2009/0064894 A1* | 3/2009 | Baumgart ............... C09D 1/00 106/18.32 |
| 2009/0289395 A1 | 11/2009 | Chou |
| 2017/0170233 A1* | 6/2017 | Tsai ..................... H01L 27/20 |

OTHER PUBLICATIONS

Office Action of corresponding Korean Patent Application No. 10-2014-0062014—7 pages (dated Mar. 31, 2016).
International Search Report dated Apr. 22, 2016 of PCT/KR2015/007464 which is the parent application—2 pages.

* cited by examiner

FIG. 1

AZ 5214 patterning
FIG. 2A

Al deposition
FIG. 2B

PR stripping
FIG. 2C

ZnO in nanoparticle
spincoating & annealing
FIG. 2D

OSCILLATION CIRCUIT INCLUDING AN ULTRAVIOLET SENSOR

CROSS-REFERENCE TO RELATED APPLICATIONS

This application is a continuation application, and claims the benefit under 35 U.S.C. §§ 120 and 365 of PCT Application No. PCT/KR2015/007464, filed on Jul. 17, 2015, which is hereby incorporated by reference.

BACKGROUND

Field

The present disclosure relates to an ultraviolet-ray (UV) sensor, and more specifically, to an UV sensor which is capable of measuring intensity of ultraviolet rays by detecting a change in frequency, and a method of manufacturing the UV sensor.

Related Art

UV Tron or a photomultiplier can sense ultraviolet rays. UV Tron is a structure in which the anode and the cathode are connected to a DC power source through series resistance in a state that an anode and a cathode are made to face each other in a container formed of material through which ultraviolet rays pass. Photoelectrons are emitted from the surface of the cathode by the photoelectric effect when ultraviolet rays are irradiated onto the cathode from the outside. The photomultiplier using borosilicate glass has a sensitivity with respect to a wavelength of 300 nm or more, and the photomultiplier using quartz glass has a sensitivity with respect to a wavelength of 160 nm or more. Channel sensor as a kind of secondary electron multipliers has a sensitivity in ultraviolet rays of 50 to 150 nm.

Conventionally, current-voltage characteristics of the sensing film have been measured to check if a used sensing film appropriately reacts to ultraviolet rays. There has been a problem that price competitiveness is dropped since trace of detection in an existing method of measuring changes in current of a thin film due to ultraviolet rays requires the advancement of measuring circuits.

U.S. Pat. No. 7,473,551 relates to nano-mechanic microsensors and methods for detecting target analytes and discloses nano-mechanic microsensors and methods using surface acoustic waves.

The present disclosure is made in association with a Korean national research and development project (research project name: Development of the Multi-sensor for UV, Ambient Light, and Proximity for Next Smart Device, project identification number: 10064078).

The disclosure of this section is to provide background of the invention. Applicant notes that this section may contain information available before this application. However, by providing this section, Applicant does not admit that any information contained in this section constitutes prior art.

SUMMARY

An embodiment of the present invention provides an UV sensor technology which is capable of measuring the intensity of ultraviolet rays by detecting a change in frequency.

An embodiment of the present invention provides an UV sensor technology which is capable of measuring a change in frequency of elastic waves using zinc oxide (ZnO) nanoparticles.

An embodiment of the present invention provides an UV sensor technology which is capable of ensuring price competitiveness even when detecting trace of ultraviolet rays.

In embodiments, the UV sensor comprises a piezoelectric material, a sensing film which is arranged on the piezoelectric material and senses ultraviolet rays. The UV sensor further comprises an elastic wave input unit which is arranged on one end of the sensing film on the piezoelectric material and provides the sensing film with an elastic wave generated based on an electrical signal and an elastic wave output unit which is arranged on the other end of the sensing film on the piezoelectric material and senses a change in frequency of the electrical signal generated based on the provided elastic wave.

In an embodiment, since characteristics of the film itself are changed if ultraviolet rays are sensed, the sensing film changes speed of an elastic wave passing through a lower end of the sensing film, and the elastic wave output unit can sense a change in frequency.

In an embodiment, the sensing film is formed by spincoating the ZnO nanoparticles on the elastic wave input unit, the elastic wave output unit, and the piezoelectric material. Further, the sensing film may have improved electrical or mechanical properties by annealing the spincoated sensing film.

In an embodiment, the sensing film changes a propagation speed of the elastic wave through a change in electrical conductivity when the ultraviolet rays are sensed.

In an embodiment, the elastic wave input unit is arranged on one end of the sensing film to propagate the elastic wave generated through the electrical signal to the lower end of the sensing film, and the elastic wave output unit is arranged on the other end of the sensing film and generates an electrical signal through the propagated elastic wave to be able to sense a frequency change of the propagated elastic wave.

In an embodiment, the elastic wave input unit and the elastic wave output unit is formed in the IDT formed through aluminum (Al) deposition.

Here, the elastic wave input unit and the elastic wave output unit are each arranged on both ends of the sensing film on the piezoelectric material, and may be formed in a lattice structure.

In an embodiment, the piezoelectric material is arranged on lower ends of the sensing film, the elastic wave input unit and the elastic wave output unit, and an elastic wave may pass through an upper portion of the piezoelectric material.

In embodiments, a method of manufacturing the UV sensor comprises the steps of: preparing the piezoelectric material, generating an IDT pattern (including a light-sensitive area and a light-insensitive area) on the piezoelectric material through a photoresist solution, depositing a thin film on the IDT pattern-generated piezoelectric material; stripping the light-sensitive area to remove the photoresist solution and the thin film deposited on the photoresist solution, and spincoating the photoresist solution and the deposited thin film-removed piezoelectric material with the ZnO nanoparticles.

Here, the method of manufacturing the UV sensor may comprise the step of annealing the sensing film on the spincoated piezoelectric material.

In an embodiment, the step of generating the pattern uses an AZ®5214 photoresist solution. (AZ® is a registered trademark of Merck Performance Materials GmbH).

In an embodiment, the IDT formed through the Al deposition in the step of generating the pattern is formed on the light-insensitive area, wherein the step of generating the pattern may include forming the light-insensitive area in a lattice structure.

In an embodiment, the deposition step includes using a thin film growth method using aluminum.

A certain embodiments of the present invention has following advantages. However, since a specific embodiment may provide all the following effects or a few of them, the scope of the disclosure is not limited to the following advantages.

The UV sensor according to an embodiment of the present invention measures intensity of ultraviolet rays by detecting a change in frequency.

The UV sensor according to an embodiment of the present invention secures price competitiveness since the UV sensor measures a change in frequency of the elastic wave using the ZnO nanoparticles.

The method of manufacturing the UV sensor according to an embodiment of the present invention improves sensitivity of the sensor by enabling the particles having large surface areas due to their characteristics to react with a larger amount of ultraviolet rays.

DESCRIPTION OF EMBODIMENTS

It should not be understood that the scope of rights of the disclosed technology is limited by the embodiments described below.

The terms described in the specification should be understood as follows.

In the description, the terms "first", "second" and so on are used to distinguish one element from another element, and the elements are not defined by the above terms.

If it is mentioned that an element is "coupled" to another element, it should be understood that the element is directly coupled to another element or still another element is interposed therebetween. On the contrary, when it is mentioned that an element is "directly coupled" to another element, it should be understood that still another element is not interposed therebetween. Other expressions explaining a relationship between the elements, i.e., "between" and "directly between", or "adjacent to" and "directly adjacent to", and so on should be interpreted in the same manner.

It should be understood that an expression used in the singular encompasses the expression in the plural, unless it has a clearly different meaning in the context. In the present application, it should be understood that terms such as "include" or "have", are intended to indicate that proposed features, numbers, steps, operations, components, parts, or combinations thereof exist, and the probability of existence or addition of one or more other features, steps, operations, components, parts or combinations thereof is not excluded thereby.

Figure 1:
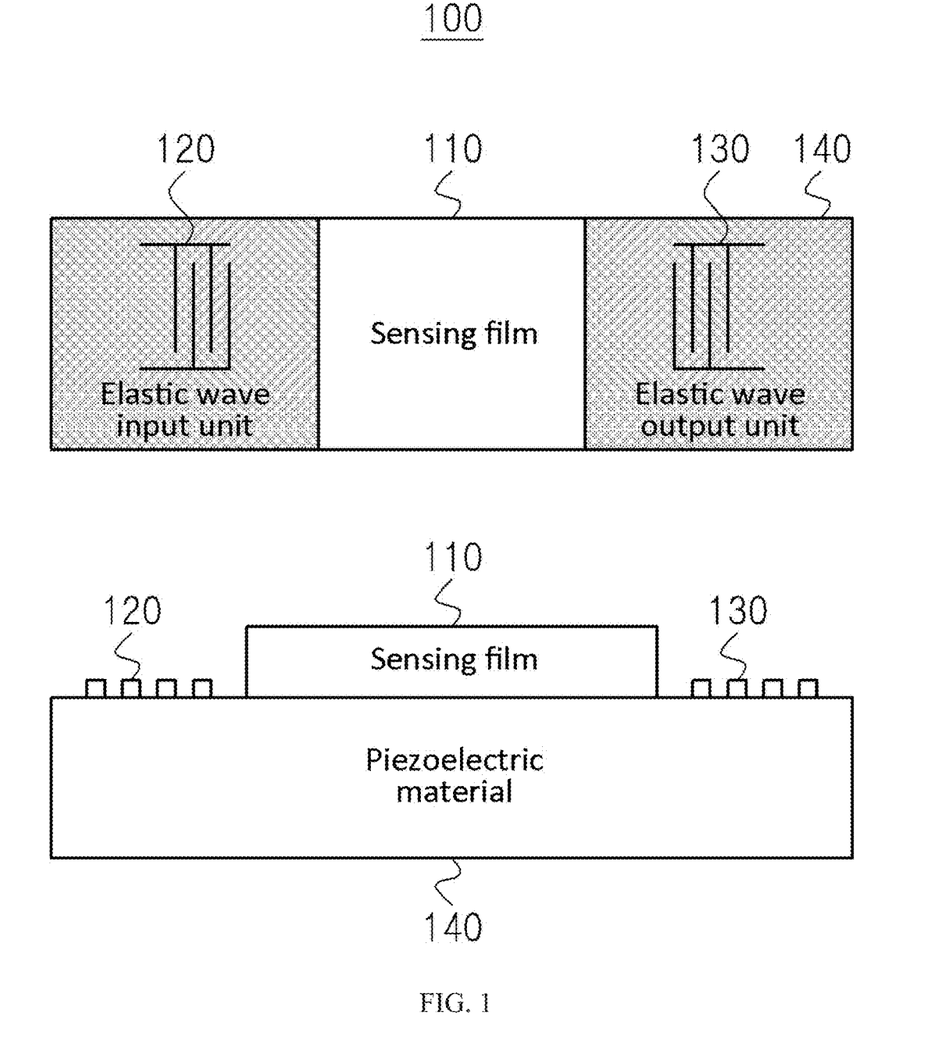
FIG. 1 is a diagram showing the structure of an UV sensor according to an embodiment of the present invention.

FIG. 1 is a diagram showing the structure of an UV sensor according to an embodiment of the present invention.

Referring to FIG. 1, the UV sensor 100 includes a sensing film 110, an elastic wave input unit 120, an elastic wave output unit 130, and a piezoelectric material 140.

The sensing film 110 is arranged on the piezoelectric material 140, may be equivalent to a material which senses ultraviolet rays, and characteristics of the concerned material itself may be changed by making the material react with ultraviolet rays. In an embodiment, the sensing film 110 is formed through the ZnO nanoparticles. Hereinafter, adsorption rate of the ZnO nanoparticles will be described with reference to FIG. 4.

In an embodiment, the sensing film 110 is formed by spincoating the ZnO nanoparticles on the elastic wave input unit 120, the elastic wave output unit 130, and the piezoelectric material 140. Here, the sensing film 110 may have improved electrical or mechanical properties by annealing the spincoated sensing film.

The elastic wave input unit 120 is arranged on one end of the sensing film 110 on the piezoelectric material 140. In an embodiment, the elastic wave input unit 120 is arranged to face the elastic wave output unit 130 with respect to the sensing film 110. The elastic wave input unit 120 may form an electrical field by receiving an external electrical signal, and the piezoelectric material 140 may generate mechanical vibration (that is, an elastic wave) through the formed electrical field. As a result, the elastic wave input unit 120 may provide the sensing film 110 with the elastic wave generated based on the external electrical signal.

In an embodiment, the elastic wave input unit 120 may be formed into the IDT formed through the Al deposition. Here, the IDT may generate an elastic wave efficiently, and may propagate the elastic wave along a solid surface (for example, between the sensing film 110 and the piezoelectric material 140). More specifically, the elastic wave input unit 120 may be formed by arranging a metal electrode on the piezoelectric material 140, and may convert the electrical signal into the elastic wave. In an embodiment, the elastic wave input unit 120 is formed in a lattice structure. For example, the lattice structure refers to a structure in which a width and a length cross perpendicularly with an interval therebetween.

The elastic wave output unit 130 is arranged on the other end of the sensing film 110 on the piezoelectric material 140. In an embodiment, the elastic wave output unit 130 is arranged to face the elastic wave input unit 120 with respect to the sensing film 110. The elastic wave output unit 130 may generate the electrical signal when the mechanical vibration (that is, the electric wave) generated by the elastic wave input unit 120 is applied. As a result, the elastic wave output unit 130 may sense a frequency change of the generated electrical signal by generating the electrical signal based on the elastic wave provided by the elastic wave input unit 120.

In an embodiment, the elastic wave output unit 130 is formed into the IDT formed through the Al deposition. Here, the IDT may efficiently detect the elastic wave propagated along the solid surface (for example, between the sensing film 110 and the piezoelectric material 140). More specifically, the elastic wave output unit 130 may be formed by arranging the metal electrode on the piezoelectric material 140, and functions as a filter for filtering a predetermined frequency band in the process of converting the propagated elastic wave into the electrical signal. In an embodiment, the elastic wave output unit 130 is formed in a lattice structure on the piezoelectric material 140. For example, the lattice structure refers to a structure in which the width and the length cross perpendicularly with an interval therebetween.

The piezoelectric material 140 may generate the mechanical vibration (that is, the elastic wave) by receiving the electrical signal, and may generate an electrical signal (for example, a voltage) by applying mechanical vibration to a piezoelectric body. In an embodiment, the piezoelectric material 140 includes a piezoelectric substrate (for example, a semiconductor substrate) or a piezoelectric thin film. Here, a specific frequency band of the mechanical vibration may be used as a reference signal source of the UV sensor 100. Namely, the piezoelectric material 140 may generate the mechanical vibration (that is, the elastic wave) when an electrical signal is applied through a piezoelectric effect and an inverse piezoelectric effect, and may generate the electrical signal when the mechanical vibration is applied.

Figure 2A:
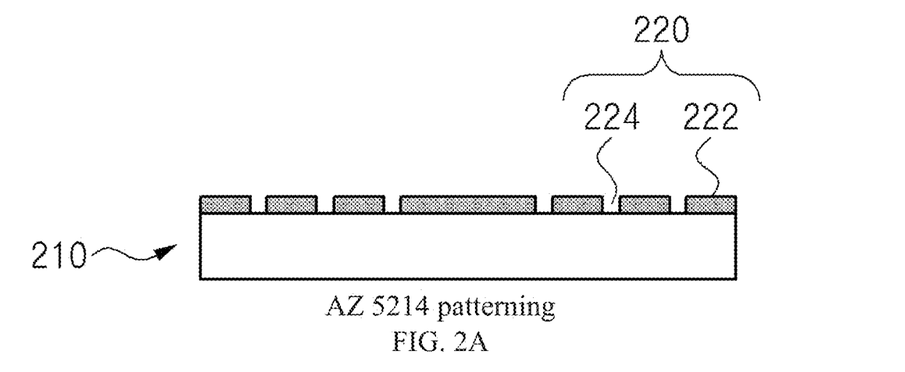
FIGS. 2A to 2D illustrate a process for manufacturing an UV sensor according to an embodiment of the present invention.
Figure 2B:
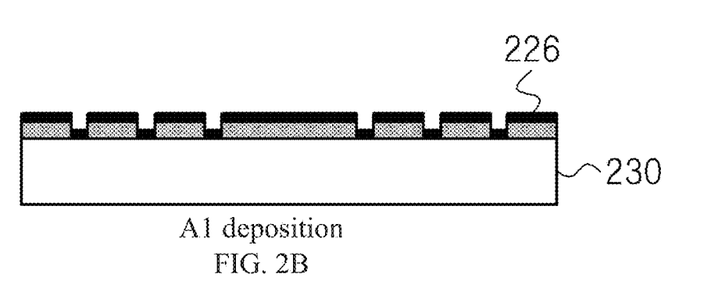

FIGS. 2A to 2B illustrate a method of manufacturing an UV sensor according to another embodiment of the present invention.

In FIG. 2A, the piezoelectric material 140 is patterned through a photoresist solution 222 such that the piezoelectric material 140 may generate a pattern 220. Here, the pattern 220 may form irregularities from a cross-sectional viewpoint, and may include a light-sensitive area (that is, a protruding region) 222 and a light-insensitive area (that is, a depressed region) 224. Finally, the light-insensitive area (that is, the depressed region) 224 may be remained on the piezoelectric material 140, and the light-sensitive area (that is, the protruding region) 222 may be removed. Since a chemical reaction of the photoresist solution is caused when light is irradiated onto the photoresist solution, chemical properties of the photoresist solution may be changed, and may correspond to the AZ5214 photoresist solution. This is mainly because the film is thin and uniform such that the film may make it easy to obtain a fine circuit pattern, and the film may have a good sensitivity for ultraviolet rays. In an embodiment, the light-insensitive area 224 is formed in the lattice structure such that the IDT may be formed.

In FIG. 2B, a pattern-formed piezoelectric material 210 may be deposited on a thin film 226. In an embodiment, deposition grows the thin film through a chemical vapor deposition (CVD) process. In another embodiment, deposition grows the thin film through a low pressure CVD process, a plasma-enhanced CVD, or atmospheric pressure CVD process. Here, the thin film may include aluminum (Al). This is because aluminum is excellent in malleability and ductility and has good electrical conductivity. Further, the thin film 226 may include oxide and nitride.

Figure 2C:
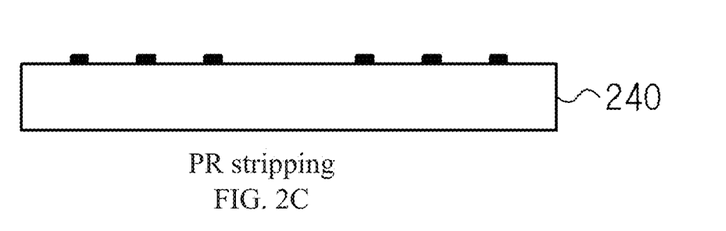

In FIG. 2C, the photoresist solution 222 and the thin film 226 deposited on the photoresist solution 222 may be removed by stripping the light-sensitive area 222. More specifically, the photoresist solution 222 and the thin film 226 remained on an aluminum-deposited piezoelectric material 230 may be removed through an alkali chemical. Here, the light-sensitive area 222 refers to an area on which the piezoelectric material 140 is patterned through the photoresist solution, and the light-insensitive area 224 refers to an area except for the light-sensitive area 222. As a result, the light-insensitive area 224 is formed in a lattice structure on a piezoelectric material 240 such that the light-insensitive area 224 may form an IDT. In an embodiment, the IDT is formed through aluminum (Al) deposited on the light-insensitive area 224.

Figure 2D:
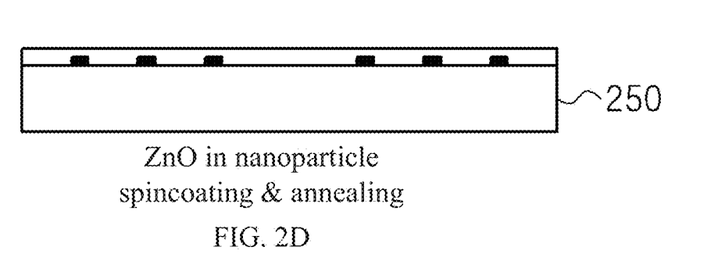

In FIG. 2D, the piezoelectric material 240 having the photoresist solution 222 and the deposited thin film 226 removed therefrom may be spincoated through the ZnO nanoparticles. More specifically, the piezoelectric material 240 having the photoresist solution 222 and the deposited thin film 226 removed therefrom may be rotated at a high speed when the ZnO nanoparticles are flown in the piezoelectric material 240. As a result, the ZnO nanoparticles may be spread out thinly on the piezoelectric material 240.

In an embodiment, a sensing film 250 on the spincoated piezoelectric material is annealed. More specifically, the spincoated sensing film 250 may be heated to a temperature of 200° C. or more for about 1 hour to remove damage of a spincoated sensing film 250. The spincoated sensing film 250 may have improved electrical or mechanical properties when the spincoated sensing film 250 is annealed.

Again in FIG. 1 and FIGS. 2A to 2D, when ultraviolet rays are applied to the sensing film 110, i.e., the sensing film absorbs the ultraviolet rays, a recombination phenomenon of e− and h+ occurs within ZnO, electrical properties are changed accordingly. An elastic wave propagated from a boundary between the sensing film 110 and the piezoelectric material 140 may cause a propagation speed to be changed according to a change in electrical conductivity of the sensing film 110, and a result of the changed propagation speed is exhibited through the elastic wave output unit 130.

A mechanism associated with a propagation speed change of the elastic wave is capable of being represented by the following numerical formula.

$$\Delta v/v0 = K^2/(2*(1+(\sigma/\sigma m)^2))$$

Figure 3A:
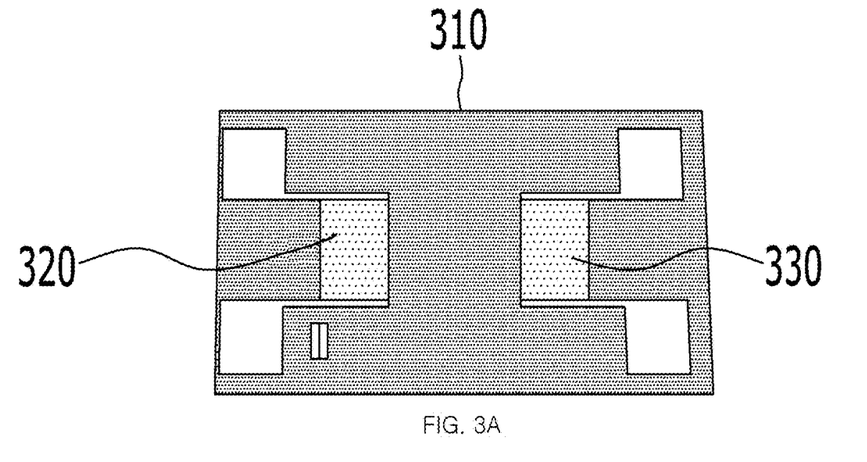
FIG. 3A shows an element manufactured using the process of FIGS. 2A to 2D.

Δv: change in propagation speed of an acoustic wave
v0: original propagation speed of an acoustic wave
K^2: electromechanical bonding force of a piezoelectric material
σ: electrical conductivity of a piezoelectric material
σm: electrical conductivity of a sensing layer FIG. 3A is a view showing an element manufactured by the method of manufacturing the UV sensor of FIGS. 2A to 2D.

Referring to FIG. 3A, the manufactured element includes a sensing film 310, an elastic wave input unit 320, and an elastic wave output unit 330.

In an embodiment, the sensing film 310 is formed through the ZnO nanoparticles. Further, the elastic wave input unit 320 and the elastic wave output unit 330 may be formed in the IDT formed through Al deposition.

Figure 3B:
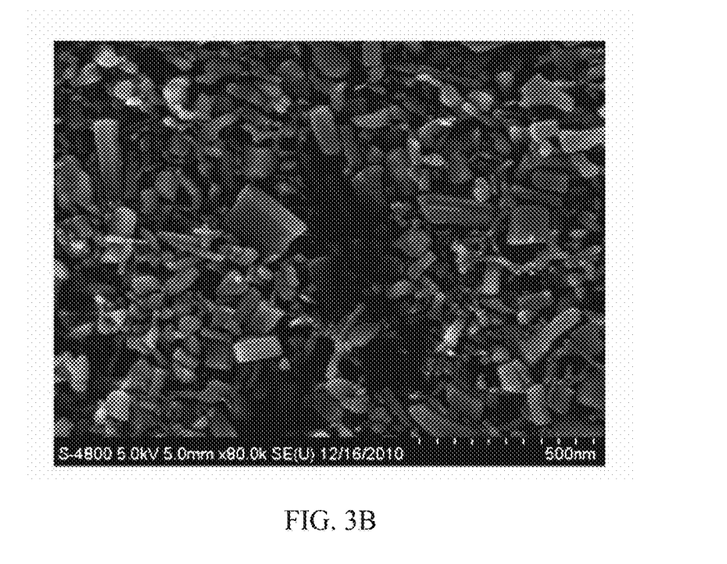
FIG. 3B is a photograph of a sensing film manufactured using the process of FIGS. 2A to 2D.

FIG. 3B is a view illustrating an image in which the sensing film manufactured by the method of manufacturing the UV sensor of FIG. 2 is photographed by an optical camera.

Referring to FIG. 3B, the sensing film 310 may be formed by spincoating the ZnO nanoparticles. Here, the particles may react to a larger amount of ultraviolet rays since the particles have a smaller process ratio than the thin film, and have a large surface area (that is, an exposed area) due to characteristics of the particles themselves. As a result, sensitivity of the sensing film 310 may be improved.

Figure 4:
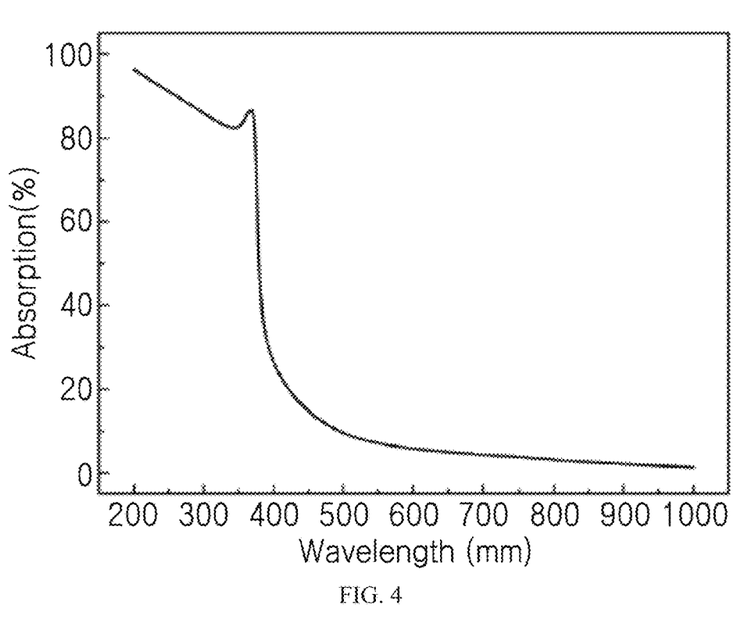
FIG. 4 is a graph showing an absorption rate according to a wave of ZnO nanoparticles according to an embodiment of the present invention.

FIG. 4 is a graph showing the absorption rate according to the wave of the ZnO nanoparticles.

Referring to FIG. 4, an X-axis and a Y-axis each represent a wavelength and an absorption rate. The measured absorption rate may exhibit a high absorption rate even at a wavelength of 400 nm or less.

As a result, the ZnO nanoparticles show an absorption rate of 80% or more at a wavelength of 400 nm or less. The wavelength of ultraviolet rays corresponds to a wavelength between 100 nm and 380 nm, it can be seen that the ZnO nanoparticles have a high ultraviolet ray absorption rate.

Figure 5:
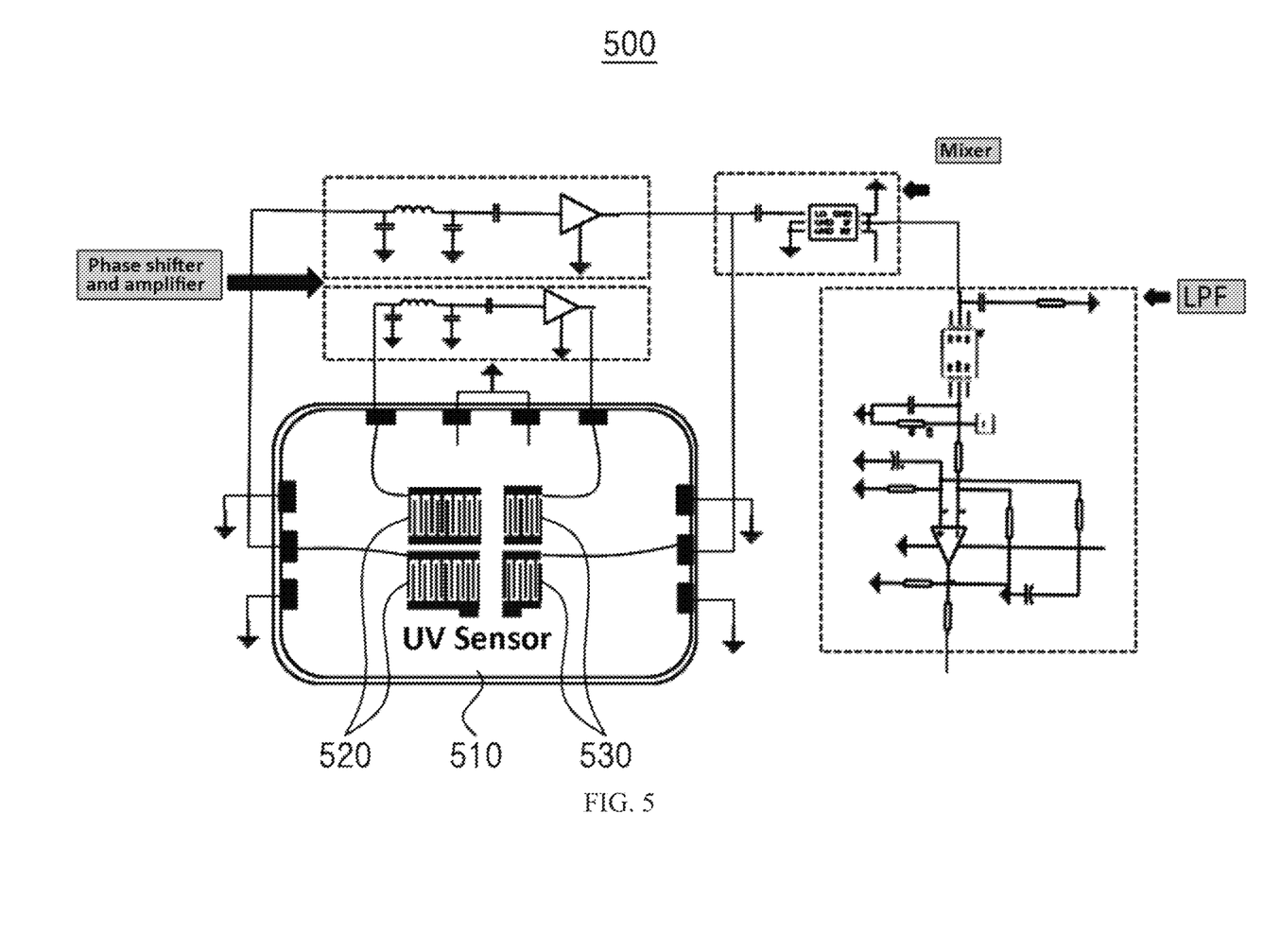
FIG. 5 is a circuit diagram illustrating an oscillation circuit in which the UV sensor according to an embodiment of the present invention is used.

FIG. 5 is a circuit diagram illustrating an oscillation circuit in which the UV sensor according to an embodiment of the present invention is used.

An oscillation circuit 500 may drive the elastic wave using an UV sensor 510. More specifically, if an electrical signal is applied to an elastic wave input unit 520 through the oscillation circuit 500, the elastic wave input unit 520 may form an electric field through the received electrical signal. The piezoelectric material 140 generates an elastic wave through the formed electric field, and the generated elastic wave is propagated to an elastic wave output unit 530 through a sensing film. The elastic wave output unit 530 may form an electrical signal through the propagated elastic wave. As a result, the insertion loss of the sensing film in the oscillation circuit 500 may be measured based on the electrical signal formed in the elastic wave output unit 530. Further, a frequency change of the elastic wave may be measured according to the insertion loss of the sensing film 110. A method of measuring the insertion loss and a gain which is capable of being obtained by measuring the frequency change of the elastic wave will be described later.

Figure 6:
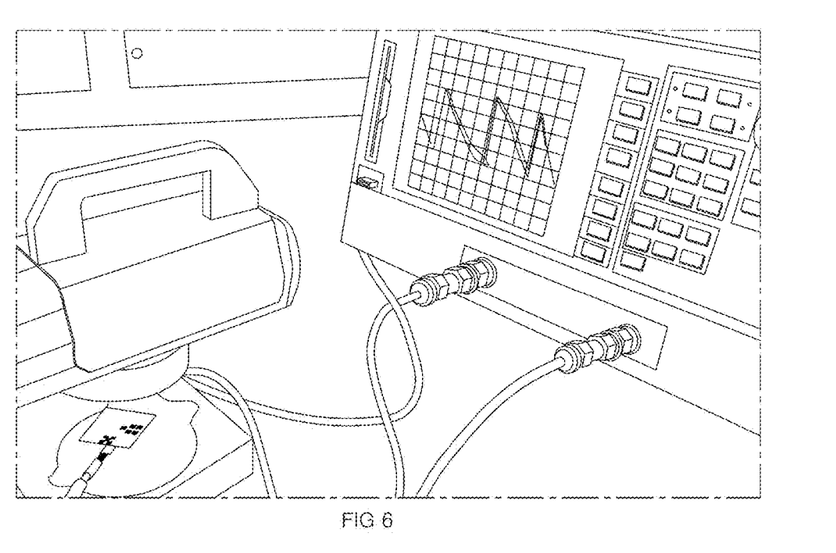
FIG. 6 is a view obtained by photographing a system which is capable of measuring a change in frequency according to an embodiment of the present invention.

FIG. 6 is a view obtained by photographing a system which is capable of measuring a change in frequency according to an embodiment of the present invention.

Referring to FIG. 6, the frequency change of the elastic wave may be measured by the system when the UV sensor absorbs ultraviolet rays. More specifically, a central frequency may be measured based on a measured result of the insertion loss when the ultraviolet rays are not applied. Thereafter, the system measuring the frequency change of the ultraviolet rays when the ultraviolet rays are applied enables a change in the central frequency to be observed when the intensity of the ultraviolet rays is varied.

Figure 7:
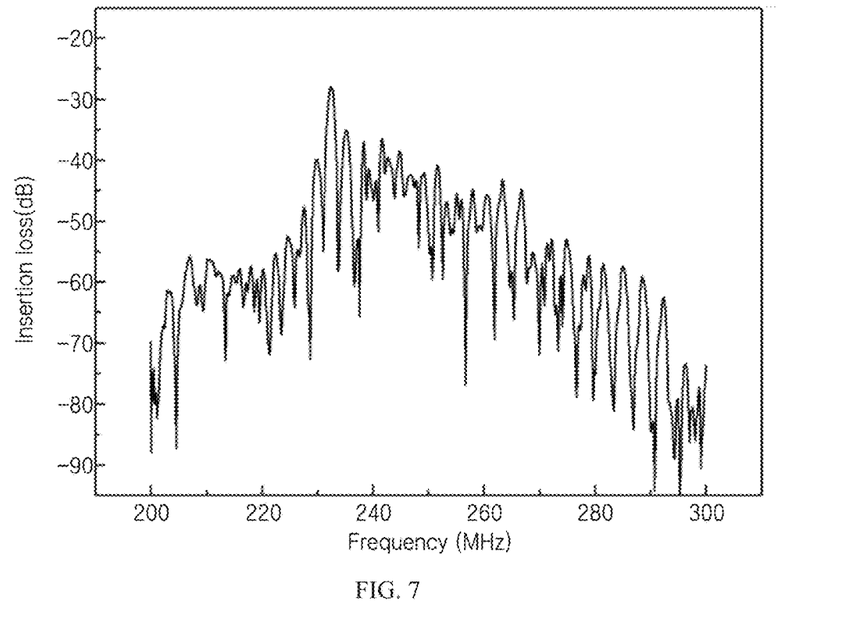
FIG. 7 is a graph showing frequency response characteristics of the UV sensor according to an embodiment of the present invention.

FIG. 7 is a graph showing frequency response characteristics of the UV sensor.

Referring to FIG. 7, an X-axis and a Y-axis each represent a frequency and an insertion loss. More specifically, a central frequency (that is, a highest gain region) may be measured based on a result of measuring the insertion loss of the elastic wave when ultraviolet rays are not applied. Namely, a frequency response characteristic of the sensing film 110 may be measured. In an embodiment, the insertion loss refers to an internal loss occurred in an operating frequency band while the elastic wave is passing through the sensing film 110. That is, the insertion loss refers to a loss occurred while the elastic wave generated based on an electrical signal is passing through the sensing film 110. Accordingly, whether the ultraviolet rays are operated or not may be understood by measuring a change of the central frequency through the insertion loss.

Figure 8:
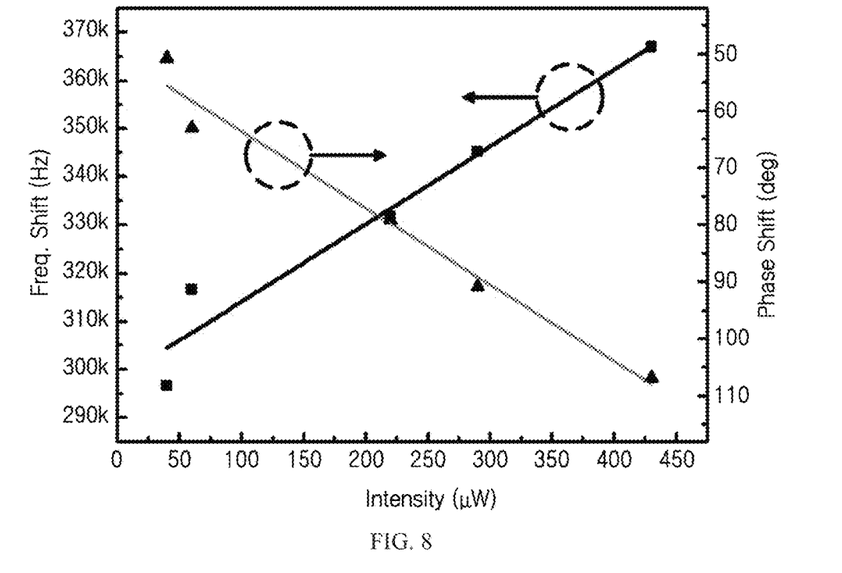
FIG. 8 is a graph showing a frequency change according to the intensity of the UV sensor according to an embodiment of the present invention.

FIG. 8 is a graph showing a frequency change according to the intensity of the UV sensor.

Referring to FIG. 8, an X-axis represents intensity of ultraviolet rays, and a Y-axis represents a frequency and a phase. More specifically, a central frequency (that is, a highest gain region) may be measured based on a result of measuring an insertion loss of the elastic wave according to the intensity of the ultraviolet rays. Here, the measured central frequency may be represented in a form that is proportional to the intensity of the ultraviolet rays.

A change in the frequency may be measured when the ultraviolet rays are applied, an UV sensor may be operated even when trace of the ultraviolet rays is detected. Accordingly, price competitiveness may be secured since the UV sensor does not require advancement of a specific circuit.

Logical blocks, modules or units described in connection with embodiments disclosed herein can be implemented or performed by a computing device having at least one processor, at least one memory and at least one communication interface. The elements of a method, process, or algorithm described in connection with embodiments disclosed herein can be embodied directly in hardware, in a software module executed by at least one processor, or in a combination of the two. Computer-executable instructions for implementing a method, process, or algorithm described in connection with embodiments disclosed herein can be stored in a non-transitory computer readable storage medium.

It is evident that the present invention is not limited to the aforementioned embodiments. Accordingly, the range of protection of the present invention should be interpreted based on the following claims, and all of technological spirits within the equivalents of the present invention may fall within the range of right of the present invention by changes, substitutions and replacements without departing from the gist of the present invention.

Certain embodiments of the present invention relate to an UV sensor which is capable of measuring intensity of ultraviolet rays by detecting a change in frequency, and a method of manufacturing the UV sensor, and has industrial applicability.

What is claimed is:

1. An oscillation circuit comprises:
   an ultraviolet-ray (UV) sensor comprising:
      a piezoelectric material;
      a sensing film arranged on the piezoelectric material and configured to sense ultraviolet rays, wherein the sensing film includes first and second ends opposing each other;
      an elastic wave input unit arranged on the first end of the sensing film on the piezoelectric material and configured to provide the sensing film with an elastic wave generated based on an electrical signal; and
      an elastic wave output unit arranged on the second end of the sensing film on the piezoelectric material and configured to generate an output signal based on the provided elastic wave,
   a phase shifter and amplifier connected to the UV sensor and configured to process the output signal of the UV sensor,
   a mixer connected to the phase shifter and amplifier and the UV sensor, and configured to further process the output signal, and
   a low-pass filter (LPF) connected to the mixer,
   wherein the oscillation circuit is configured to measure a frequency change of the elastic wave when UV sensor absorbs the ultraviolet rays.

2. The circuit of claim 1, wherein the sensing film is configured to change a speed of the elastic wave passing through a lower end of the sensing film through a change in electrical conductivity when the ultraviolet rays are sensed.

3. The circuit of claim 1, wherein the elastic wave input unit is configured to propagate the elastic wave generated through the electrical signal to the lower end of the sensing film.

4. The circuit of claim 1, wherein the elastic wave output unit is configured to generate an electrical signal through the propagated elastic wave to sense a frequency change of the propagated elastic wave.

5. The circuit of claim 1, wherein the piezoelectric material is arranged on a lower ends of the sensing film, the elastic wave input unit and the elastic wave output unit, and an elastic wave is configured to pass through an upper portion of the piezoelectric material.

6. The circuit of claim 1, wherein the sensing film comprises zinc oxide (ZnO) nanoparticles.

7. The circuit of claim 1, wherein the elastic wave input unit and the elastic wave output unit are formed in an InterDigital Transducer (IDT) formed through aluminum (Al) deposition.

8. The circuit of claim 7, wherein the elastic wave input unit and the elastic wave output unit are formed in a lattice structure.

9. A method of manufacturing the oscillation circuit of claim 1, the method comprising:

preparing a piezoelectric material;

generating an InterDigital Transducer (IDT) pattern including a light-sensitive area and a light-insensitive area on the piezoelectric material using a photoresist solution;

depositing a thin film on the IDT pattern-generated piezoelectric material;

stripping the light-sensitive area to remove the photoresist solution and the thin film deposited on the photoresist solution; and spincoating the photoresist solution and the deposited thin film-removed piezoelectric material with the ZnO nanoparticles.

10. The method of claim 9, further comprising annealing the sensing film on the spincoated piezoelectric material.

11. The method of claim 9, wherein the depositing includes growing a thin film on the pattern-generated piezoelectric material using aluminum.

12. The method of claim 9, wherein the stripping includes forming the IDT formed through the Al deposition on the light-insensitive area.

13. The method of claim 9, wherein the generating includes forming the light-insensitive area in a lattice structure.

* * * * *